(12) United States Patent
Vanecek et al.

(10) Patent No.: US 8,772,080 B2
(45) Date of Patent: Jul. 8, 2014

(54) PHOTOVOLTAIC CELL AND METHODS FOR PRODUCING A PHOTOVOLTAIC CELL

(75) Inventors: Milan Vanecek, Praha 4 Modrany (CZ); Neda Neykova, Prague 6 (CZ); Karel Hruska, Prague 6 (CZ); Ales Poruba, Prague 6 (CZ); Zdenek Remes, Prague 6 (CZ); Jakub Holovsky, Prague 6 (CZ); Adam Purkrt, Prague 6 (CZ); Oleg Babchenko, Prague 6 (CZ); Johannes Meier, Corcelles (CH); Ulrich Kroll, Corcelles (CH)

(73) Assignees: Tel Solar AG, Trubbach (CH); Fyzikalni Ustave AV CR, V.V.I., Prague (CZ)

( * ) Notice: Subject to any disclaimer, the term of this patent is extended or adjusted under 35 U.S.C. 154(b) by 225 days.

(21) Appl. No.: 13/156,533

(22) Filed: Jun. 9, 2011

(65) Prior Publication Data

US 2012/0031482 A1 Feb. 9, 2012

Related U.S. Application Data

(60) Provisional application No. 61/354,779, filed on Jun. 15, 2010.

(51) Int. Cl.
*H01L 21/00* (2006.01)

(52) U.S. Cl.
USPC .......................................................... 438/98

(58) Field of Classification Search
USPC .......................................................... 438/98
See application file for complete search history.

(56) References Cited

U.S. PATENT DOCUMENTS

| | | | |
|---|---|---|---|
| 6,309,906 B1 | 10/2001 | Meier et al. | |
| 2008/0142784 A1 * | 6/2008 | Samuelson et al. | 257/14 |
| 2008/0169019 A1 * | 7/2008 | Korevaar et al. | 136/251 |
| 2011/0224330 A1 * | 9/2011 | Sodano et al. | 523/442 |
| 2011/0260164 A1 * | 10/2011 | Domine et al. | 257/53 |

FOREIGN PATENT DOCUMENTS

| | | |
|---|---|---|
| WO | 2009/116018 A2 | 9/2009 |
| WO | 2010/022527 A1 | 3/2010 |
| WO | 2010/022530 A1 | 3/2010 |

OTHER PUBLICATIONS

Meier, et al., "Amorphous Silicon Single-Junction and "Micromorph" Tandem Solar Cells Prepared in Unaxis Kai PECVD Single-Chamber Reactors," Institute de Microtechnique, Switzerland, Preprint of 20th European Photovoltaic Solar Energy Conference & Exhibition, Barcelona Jun. 6-10, 2005.

* cited by examiner

*Primary Examiner* — Julio J Maldonado
*Assistant Examiner* — Cory Eskridge
(74) *Attorney, Agent, or Firm* — Pearne & Gordon LLP

(57) ABSTRACT

A photovoltaic device is provided that includes a substrate, a first transparent conductive layer positioned on the substrate, a plurality of transparent conductive rods positioned on the first transparent conductive layer and having a growth direction, the growth direction extending in a direction away from the substrate, a photovoltaically active layer covering the plurality of transparent conductive rods rods and a conductive layer positioned on the photovoltaically active layer.

16 Claims, 12 Drawing Sheets

PHOTOVOLTAIC CELL AND METHODS FOR PRODUCING A PHOTOVOLTAIC CELL

The present invention relates to a photovoltaic cell, in particular a thin film silicon solar cell, and to methods for producing a photovoltaic cell.

BACKGROUND

Presently, amorphous silicon solar cells are industrially produced in large quantities by various producers. However, there is a limit for their absolute efficiency when converting solar energy into electricity. Solar cells may be deposited as a thin amorphous silicon film (around 300 nm of thickness) on a respective substrate. However, the efficiency of such solar cells is typically below 6%.

A strategy to increase the efficiency is to increase the light path in a thinner silicon film by light scattering at nano-rough interfaces and subsequently light trapping in the silicon layer. WO 2009/116018 discloses a photovoltaic cell in which a transparent conductive layer is structured to include a plurality of transparent conductive protruding regions. The silicon layer and its charge separating junction have a folded structure which follows the contour of the protruding regions. This folded structure increases the optical thickness of the photovoltaic cell compared to a planar arrangement. However, further improvements to the efficiency of solar cells are desirable.

SUMMARY

A photovoltaic device is provided that includes a substrate, a first transparent conductive layer positioned on the substrate, a plurality of transparent conductive rods positioned on the first transparent conductive layer and having a growth direction, the growth direction extending in a direction away from the substrate, a photovoltaically active layer covering the plurality of transparent conductive rods rods and a conductive layer positioned on the photovoltaically active layer.

A method is provided that includes providing a substrate including a first transparent conductive layer, depositing a seed layer onto the first transparent conductive layer, building up a plurality of transparent conductive rods on the seed layer, depositing a photovoltaically active layer onto the transparent conductive rods and depositing a conductive layer onto the photovoltaically active layer.

DETAILED DESCRIPTION

Figure 1:
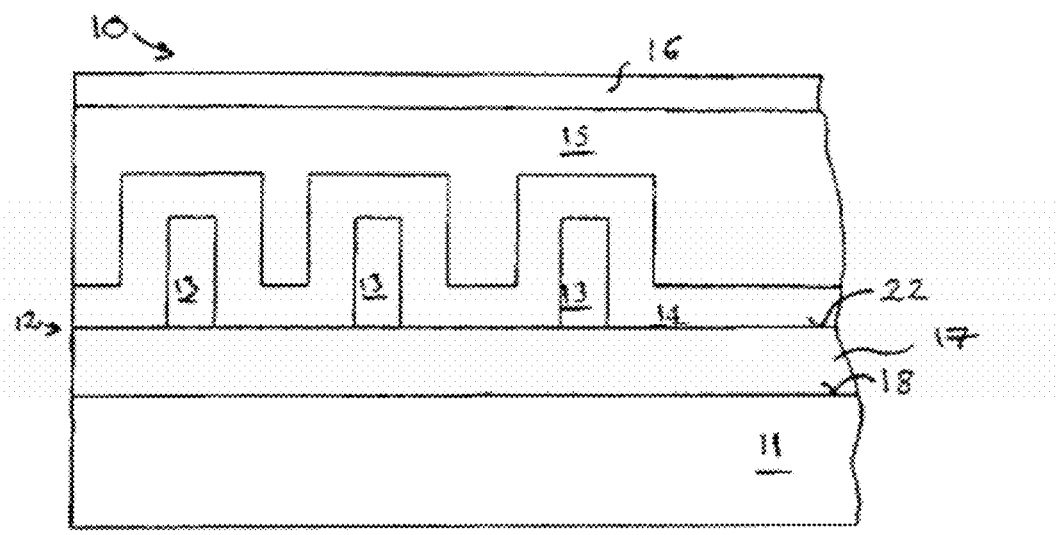
FIG. 1 illustrates a schematic cross-sectional view of a photovoltaic cell according to a first embodiment.

FIG. 1 illustrates a schematic cross-sectional view of a photovoltaic cell 10 according to a first embodiment. The photovoltaic cell 10 includes a substrate 11 in the form of a glass substrate, a first transparent conductive layer 12 positioned on the substrate 11, a photovoltaically active layer 14 deposited on the first transparent conductive layer 12, a second transparent conductive layer 15 positioned on the photovoltaically active layer 14 and a reflective layer 16 positioned on the second transparent conductive layer 15.

The glass substrate 11 is considered the front of this photovoltaic cell as the photons, in this embodiment solar energy, impinge the glass substrate 11. The reflective layer 16 is considered the back. The first transparent conductive layer 12 can be termed the front transparent conductive layer and the second transparent conductive layer 15 as the back transparent conductive layer.

The first transparent conductive layer 12 includes a continuous sub-layer 17 positioned on the major surface 18 of the substrate 11 and a plurality of rods 13 including a transparent conductive material. The transparent conductive rods 13 are positioned on the sub-layer 17 and extend away from the major surface 18 of the glass superstrate 11 and the sub-layer 17. The transparent conductive rods may be considered as being positioned generally perpendicularly to the glass superstrate 11 and the sub-layer 17.

The transparent conductive rods 13 have a diameter of around 150 nanometres and a height of 0.7 to 1.2 micrometers. In this embodiment, the transparent conductive material is an oxide, in particular, zinc oxide doped with either aluminium or boron. However, other transparent conductive oxides such as indium tin oxide may also be used. In the context of the transparent conductive layer 12, conductive refers to a material that is electrically conductive.

The plurality of transparent conductive rods 13 are produced by building up isolated, discrete regions of a transparent conductive material from the sub-layer 17 of a transparent conductive material. Each of the transparent conductive rods 13 has a growth direction due to this building-up method. The growth direction extends away from the major surface 18 of the glass superstrate 11 and away from the sub-layer 17. The growth direction can be considered to extend along the longitudinal axis of the transparent conductive rods 13. In this particular embodiment, the transparent conductive rods 13 include zinc oxide and the rods 13 may be grown using a hydrothermal technique which is described later with reference to FIGS. 2 to 5.

The photovoltaically active layer 14 is positioned conformally over the surface of the sub-layer 17 and the transparent conductive rods 13 of the first transparent conductive layer 12.

Conformal is defined herein to describe a layer which has a contour which generally matches or corresponds to the contour of the underlying surface on which the layer is positioned.

In this embodiment, the photovoltaically active layer 14 includes silicon and has a charge separating junction, which in this embodiment a p-i-n junction. The photovoltaically active layer 14 may also be described as an absorber layer or an active photovoltaic layer.

A second transparent conductive layer 15 is positioned on the photovoltaically active layer 14. In this embodiment, the second transparent conductive layer 15 fills the spaces between the columnar structures formed by the transparent conductive rods 13 of the first transparent oxide layer 12 and photovoltaically active layer 14 and extends continuously across the substrate 11 so that its upper surface is generally parallel to the major surface 18 of the substrate 11.

Light impinges the substrate 11 in a perpendicular direction to the major surface of the substrate 11. Due to the transparent conductive rods 13 of the first transparent conductive layer 12 and the conformal contour of the photovoltaically active layer 14, the photovoltaically active layer 14 and the p-i-n junction has a folded structure. This results in the photovoltaic cell 10 being optically thicker than a planar arrangement of the layers. However, transport of the photogenerated charge between the electrodes of the cell, that is the first transparent conductive layer 12 which provides a first electrode and the second transparent conductive layer 15 which provides a second electrode of the photovoltaic cell 10, is electrically thin as the thickness of the cell overall is not increased. An increased proportion of the photogenerated charge carriers can be collected in the p-i-n type structure even in the less advantageous case of light-soaked amorphous silicon or a higher defect density nano- and microcrystalline silicon.

The conformity of the silicon layer and the second transparent conductive layer may be achieved by selecting an appropriate deposition method and/or the conditions used to deposit the layers. For example, the silicon layer may be deposited using plasma enhanced chemical vapour deposition (PECVD). The second transparent conductive layer may be deposited using low pressure chemical vapour deposition (LPCVD). Low-pressure CVD processes are carried out at sub-atmospheric pressures.

Plasma enhanced CVD processes are also carried out at subatmospheric pressure, but additionally a plasma is used to enhance the reaction rate.

The photovoltaic cell 10 further includes a reflective layer 16 positioned on the second transparent conductive layer 15. The reflective layer 16 may include a white pigmented dielectric reflective media or a metal such as silver.

FIGS. 2 to 5 illustrate the fabrication of a plurality of transparent conductive rods 13 on the substrate 11 by a hydrothermal technique.

Figure 2:
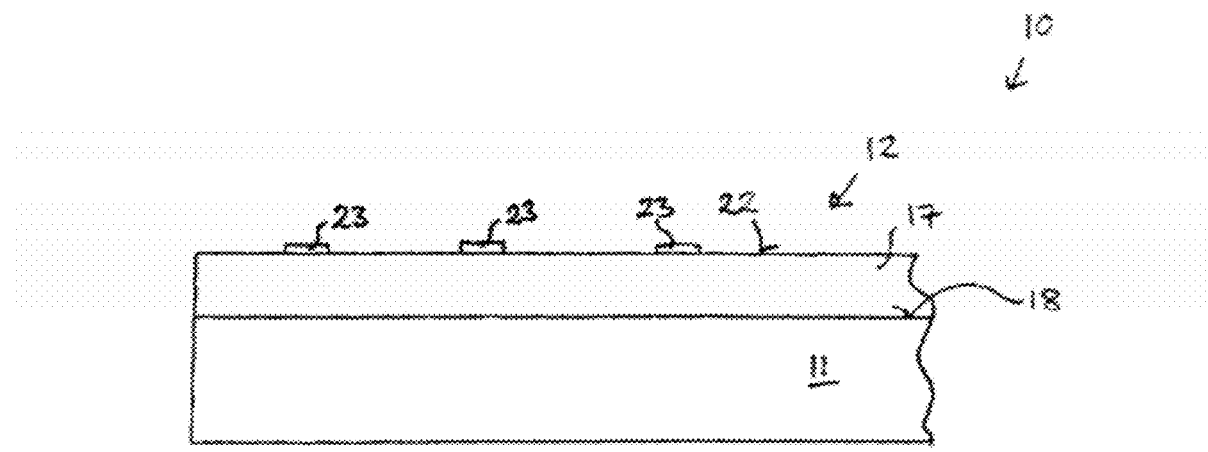
FIG. 2 illustrates a schematic cross-sectional view of a substrate with a plurality of discrete seed layer regions.

FIG. 2 illustrates a substrate 11 including a continuous layer of a transparent conductive material extending over the major surface 18. This layer of the transparent conductive material provides the sublayer 17 of the subsequently fabricated transparent conductive layer 12. A plurality of discrete, isolated seed regions 23 are positioned on the upper surface 22 of the sublayer 17. These seed regions 23 are, in this embodiment, circular and have a diameter of about 150 nm. These structured seed regions 23 may be deposited by a printing technique that employs the use of a mask, for example.

In a particular embodiment, the substrate 11 of glass including a doped-ZnO sub-layer 17 is cleaned in isopropyl alcohol, then rinsed in de-ionised water and blown in a stream of $N_2$ to dry it before the subsequent growth of the transparent conductive rods 13.

A seeding solution may include 0.005M zinc acetate dihydrate in ethanol. The seeded regions 23 may be deposited onto the sub-layer 17 by wetting the substrate 11 by a droplet of the seeding solution, drying and heating to 200 to 350° C. in air.

Figure 3:
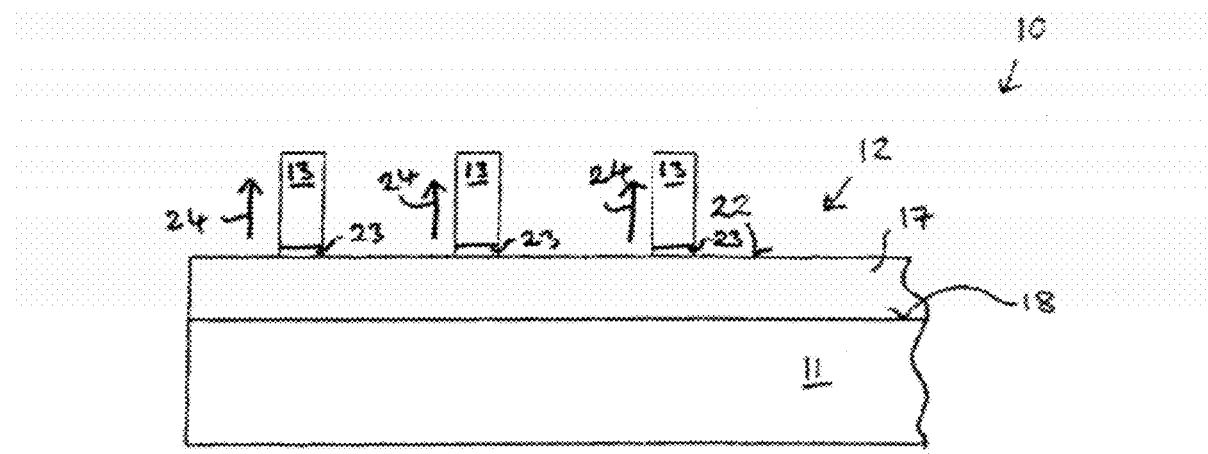
FIG. 3 illustrates the growth of ZnO rods on a plurality of discrete seed layer regions.

FIG. 3 illustrates the buildup of transparent conductive material on these seed regions 23 as indicated by the arrows 24 to form a plurality of transparent conductive rods 13. In this embodiment, the transparent conductive rods 13 are fabricated using a hydrothermal technique.

In a particular embodiment, the transparent conductive rods are grown from an aqueous solution of 25 mM zinc nitrate hexahydrate $Zn(NO_3)_2.6H_2O$ and 25 mM hexamethylenetetramine (HMTA) $C_6H_{12}N_4$.

The transparent conductive rods 13 are grown by immersing the substrate 11 with the seeded regions 23 upside-down in an aqueous solution containing zinc acetate hexahydrate and HMTA at 85° for 3 h. After finishing the reaction, the substrates 11 are rinsed in de-ionized water and blown in a steam of $N_2$.

ZnO rods may be grown from this solution at a rate of 1.8 to 2.5 microns/3 hours is equal to 0.6 to 0.8 micron/hour. 90 minutes may be used for growth of 0.7 to 1.1 microns long ZnO rods 13 on the seed regions 23.

A higher solution temperature may shorten the growth time. For example, a growth time of 1 to 5 hours may be used for a solution temperature of 85° C. and a growth time of 20 to 100 minutes may be used for a solution temperature 95° C. In one example, a deposition time of 30 minutes may be used for a solution temperature of 95° C.

The size of the seed regions 23 can be defined so as to promote growth of a single rod on a defined area. In an embodiment, the seed regions are circular with diameter roughly 100 nm in order to form a single rod on each seed region 23. If the area of the seed regions is larger, for example 150 nm or 300 nm, part of the rods may grow in clusters of several nanocolumns/nanorods.

Figure 4:
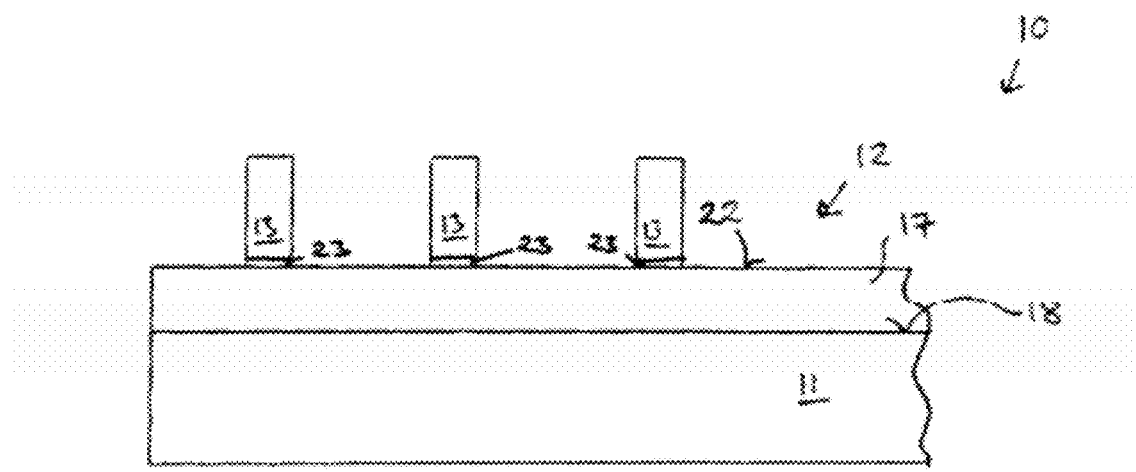
FIG. 4 illustrates a substrate with a plurality of ZnO rods.

FIG. 4 illustrates a schematic cross-sectional view of the substrate 11 after the fabrication of the first transparent conductive layer 12 including a continuous transparent conductive oxide (TCO) sub-layer 17 and plurality of transparent conductive rods 13 extending away from the major surface 18 of the substrate 11.

Figure 5:
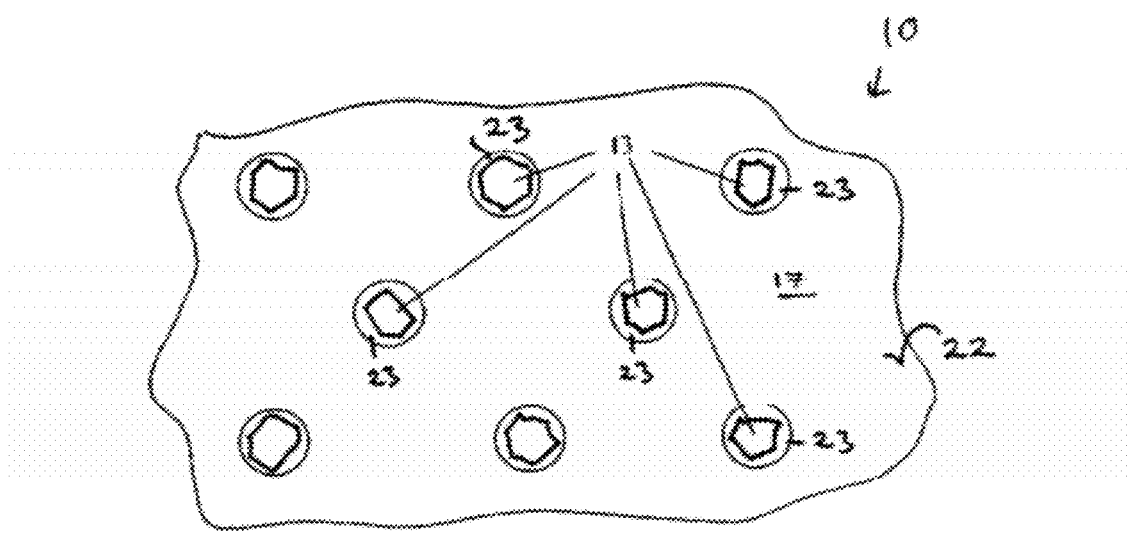
FIG. 5 illustrates a top view of a substrate with a plurality of ZnO rods.

FIG. 5 illustrates a top view of the substrate 11 with a transparent conductive oxide (TCO) sub-layer 17 and transparent conductive rods 13 which are positioned on seed regions 23. The transparent conductive rods 13 have a generally hexagonal cross-section which may be regular or irregular. The transparent conductive rods 13 are arranged in a hexagonal close packed arrangement which enables the packing density of the transparent conductive rods 13 to be maximised. The lateral arrangement of the transparent conductive rods 13 may be defined by arranging the seed regions 23 in the desired lateral arrangement.

Figure 6:
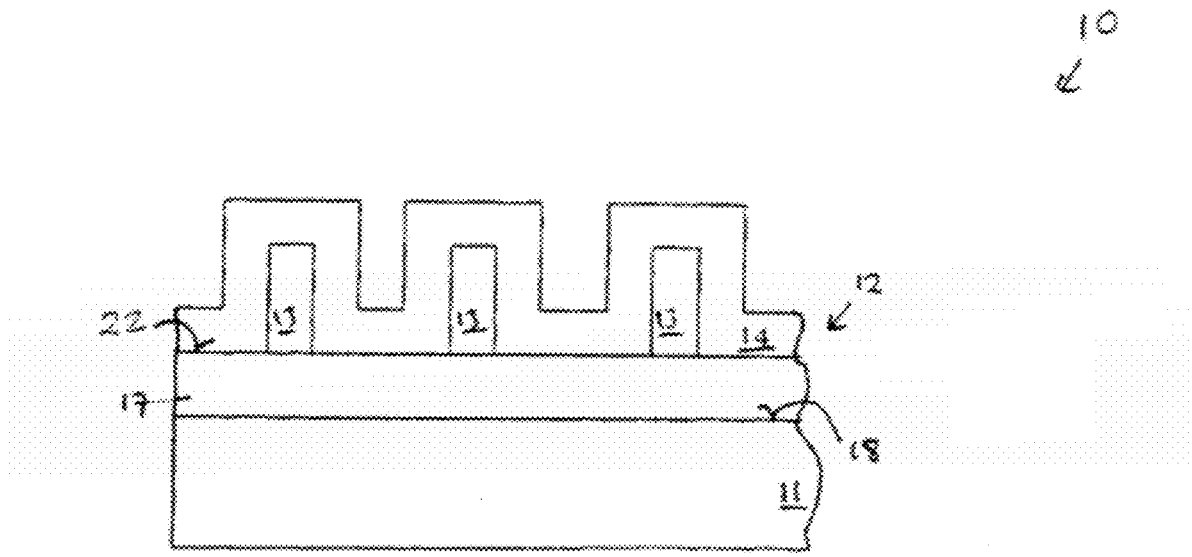
FIG. 6 illustrates the deposition of a thin film silicon photovoltaic layer onto a plurality of ZnO rods.
Figure 7:
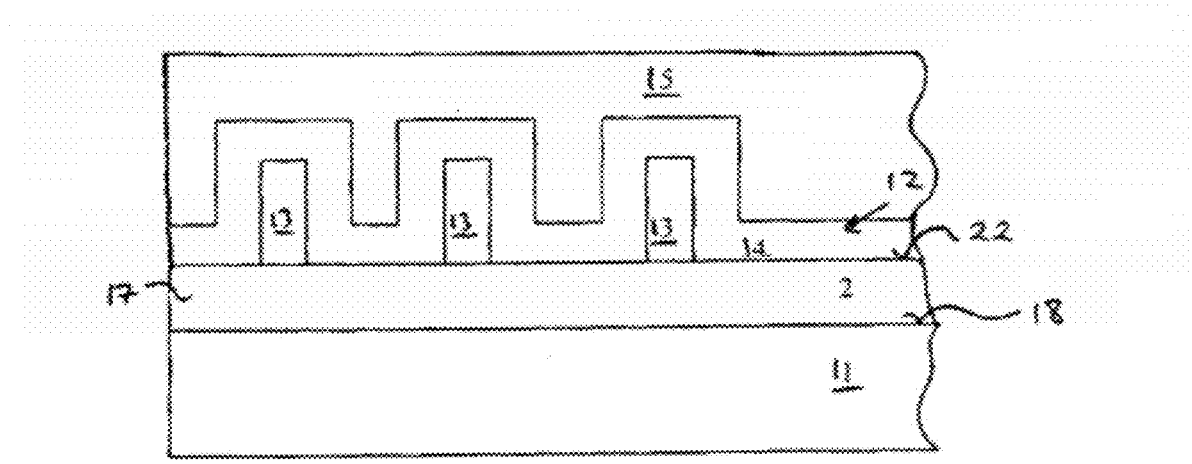
FIG. 7 illustrates the deposition of a second transparent conductive layer onto a thin film silicon photovoltaic layer covering a plurality of ZnO rods.

FIGS. 6 and 7 illustrate the fabrication of the further layers of photovoltaic cell 10 on the transparent conductive layer 12 with transparent conductive roads 13.

FIG. 6 illustrates a schematic cross-sectional view of the substrate 11, the sub-layer 17 and transparent conductive rods 13 and a photovoltaically active layer 14 arranged conformally on the sub-layer 17 and transparent conductive rods 13. In this embodiment, the photovoltaically active layer 14 is provided by an amorphous silicon layer having a p-i-n structure as illustrated in FIG. 8.

FIG. 7 illustrates the structure of FIG. 6 after the deposition of a second transparent conductive layer 15, for example, of a transparent conductive oxide, in particular of ZnO doped with aluminium. The photovoltaically active layer 14 is covered with the second transparent conductive layer 15 which acts as a collecting electrode.

Figure 8:
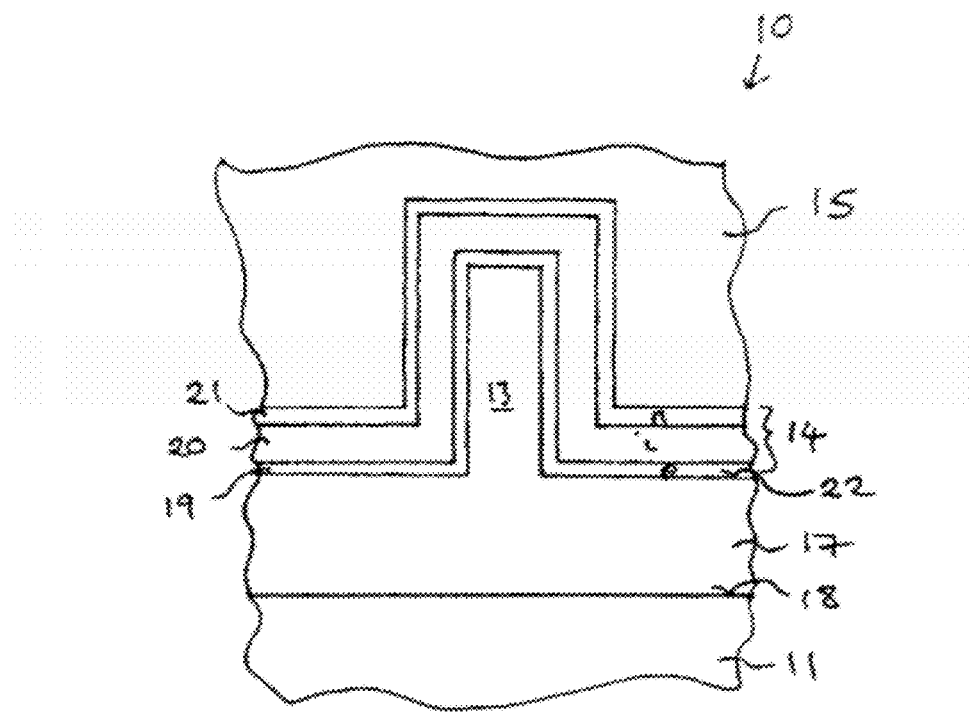
FIG. 8 illustrates the p-i-n structure of the thin film silicon photovoltaic layer.

FIG. 8 illustrates the p-i-n structure of the silicon providing the photovoltaically active layer 14 of the photovoltaic cell 10. The silicon layer 14 includes three sub-layers. A first sub-layer 19 is deposited conformally on the sub-layer 17 and transparent conductive rods 13 of the first transparent conductive layer 12. The first sub-layer 19 is positively doped and provides the p-layer of the p-i-n junction. The second sub-layer 20 is intrinsic silicon and is positioned conformally on the first sub-layer 19 to provide the i-layer. The third sub-layer 21 is negatively-doped silicon and is positioned conformally on the intermediate second sub-layer 20 to provide the n-layer of the charge separating junction. The silicon layer may have the structure and be fabricated by a method disclosed in U.S. Pat. No. 6,309,906 which is incorporated herein by reference in its entirety.

Figure 9A:
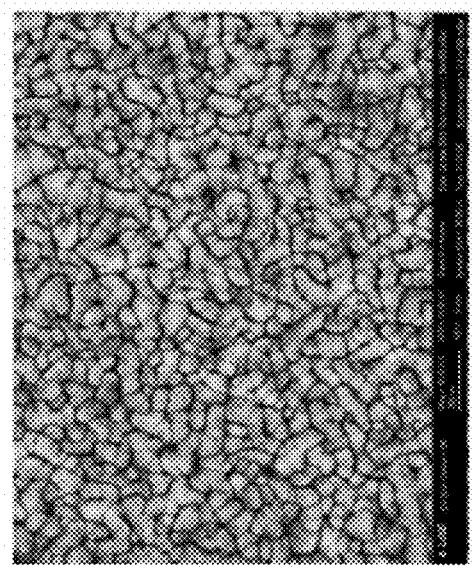
FIG. 9a illustrates a SEM micrograph of a seed layer.

FIG. 9a illustrates a SEM micrograph of a seed layer of ZnO which was deposited from a solution onto a substrate including a continuous ZnO layer as described above.

Figure 9B:
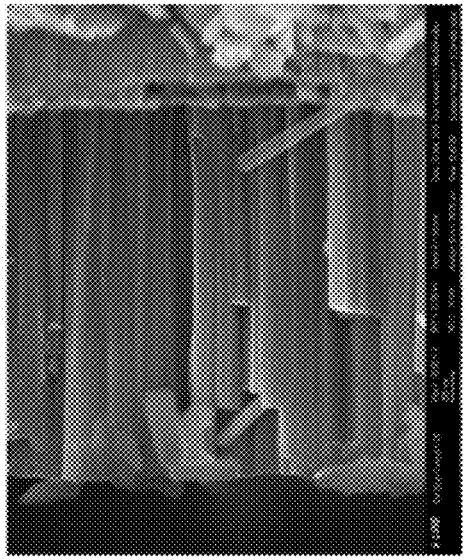
FIG. 9b illustrates a SEM micrograph of ZnO rods grown on the seed layer.
Figure 9C:
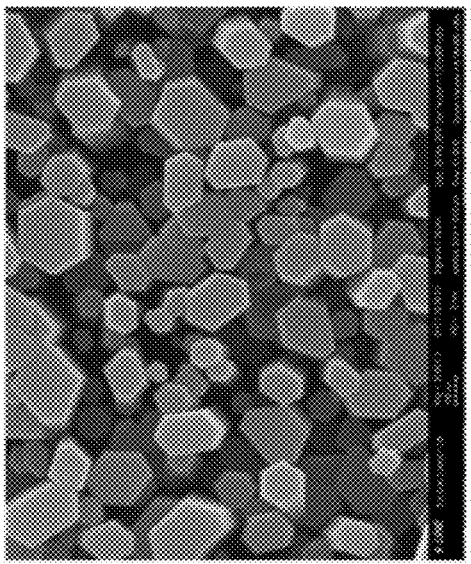
FIG. 9c illustrates a SEM micrograph of ZnO rods grown on the seed layer.

FIGS. 9b and 9c each illustrate a SEM micrograph of ZnO rods grown on the seed layer by the hydrothermal technique described above. The growth time was 3 hours.

Figure 10:
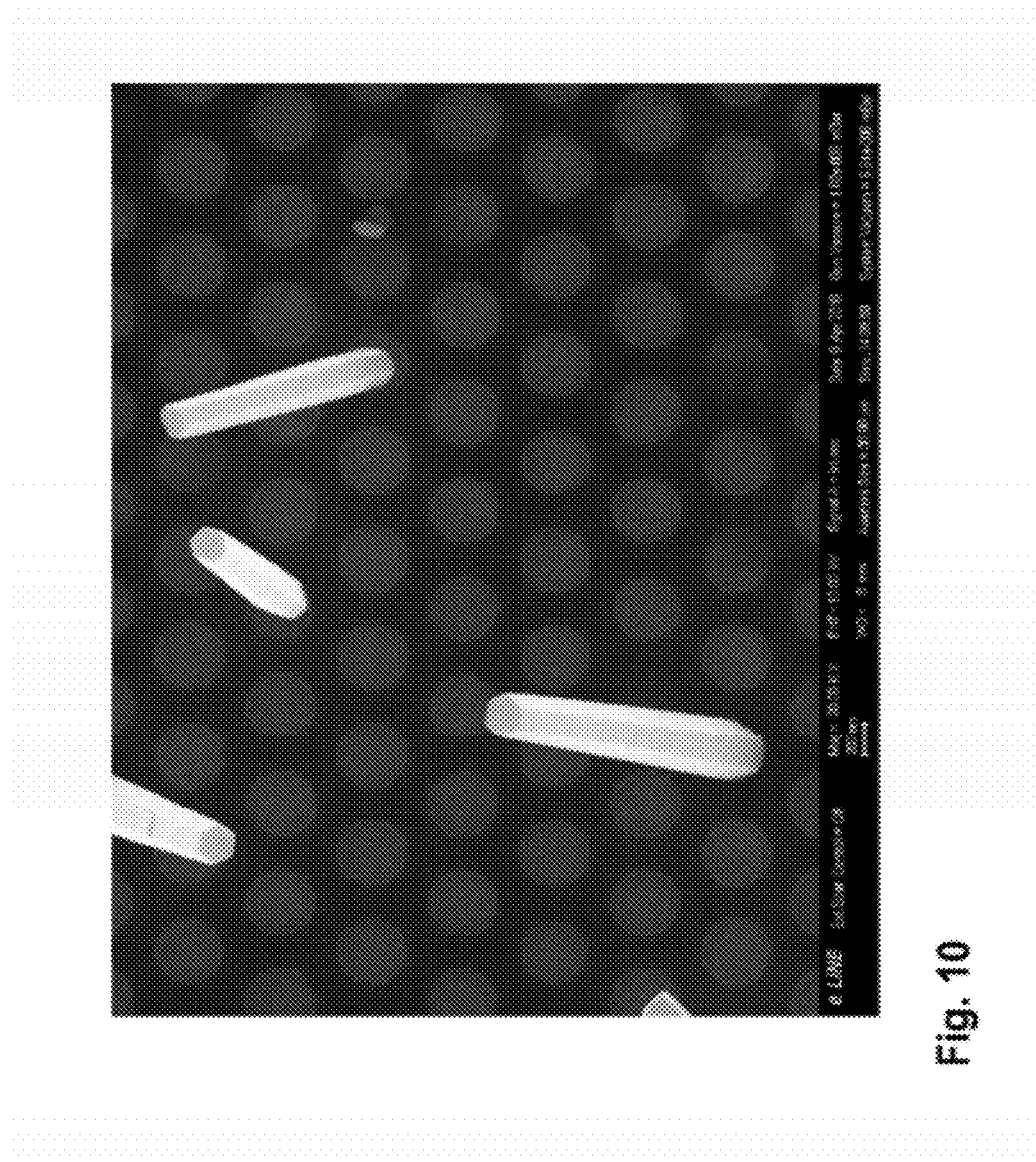
FIG. 10 illustrates a SEM micrograph of ZnO rods grown on a substrate without a seed layer.

FIG. 10 illustrates a SEM micrograph of ZnO rods grown on a substrate without a seed layer. The substrate is flat indium tin oxide (ITO) without ZnO seeding, but with circular areas opened in e-beam resist. The SEM micrographs illustrate little growth of rods and just occasional rod growth.

Figure 11B:
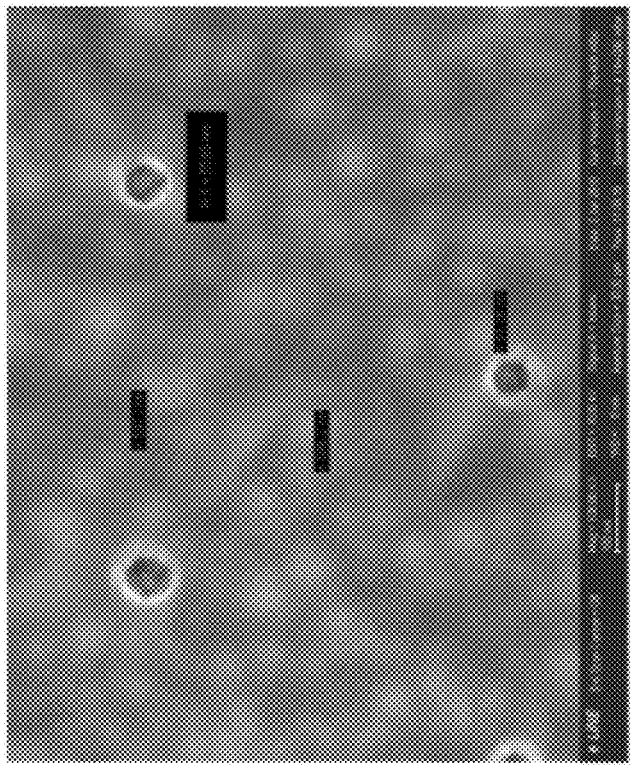
FIG. 11b illustrates a SEM micrograph of a seeded substrate with circular openings in a resist for ZnO rod growth.
Figure 11A:
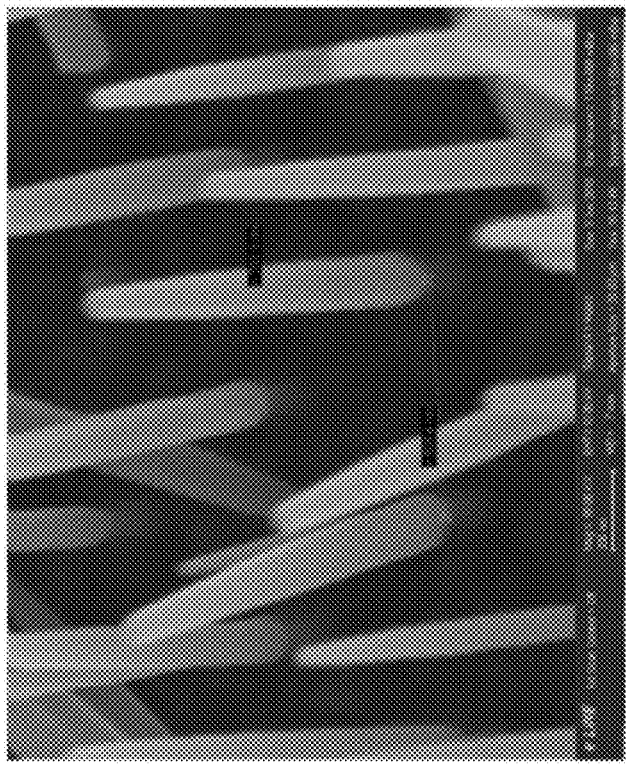
FIG. 11a illustrates a SEM micrograph of ZnO rods.
Figure 11C:
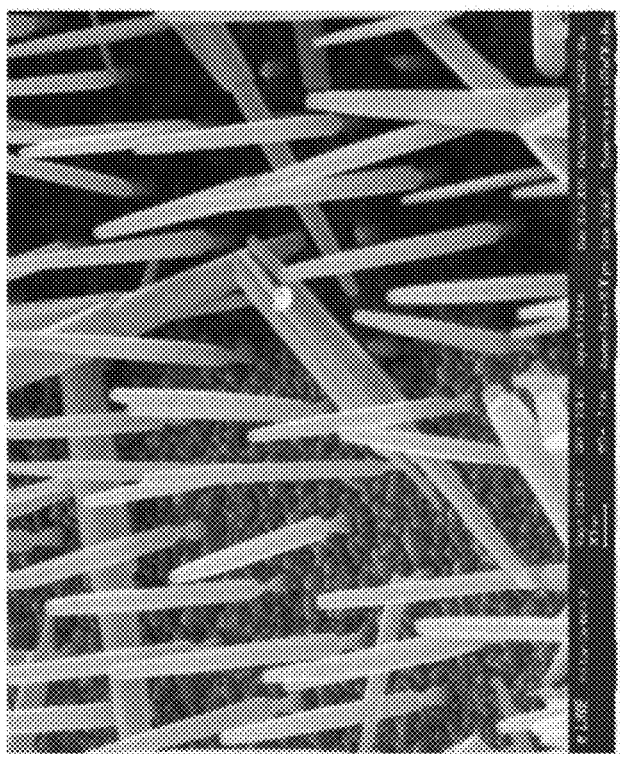
FIG. 11c illustrates a substrate with ZnO rods with a resist removed and with the resist present.

FIGS. 11a to 11c illustrate SEM micrographs. The substrate is glass with a ZnO layer and a seed layer. The diameter of circular opening in the e-beam resist is 55 nm.

FIG. 11b illustrates a SEM micrograph of a seeded substrate with circular openings in a resist for ZnO rod growth.

FIG. 11c illustrates a substrate with ZnO rods with a resist removed (left) and with the resist present (right).

Figure 12A:
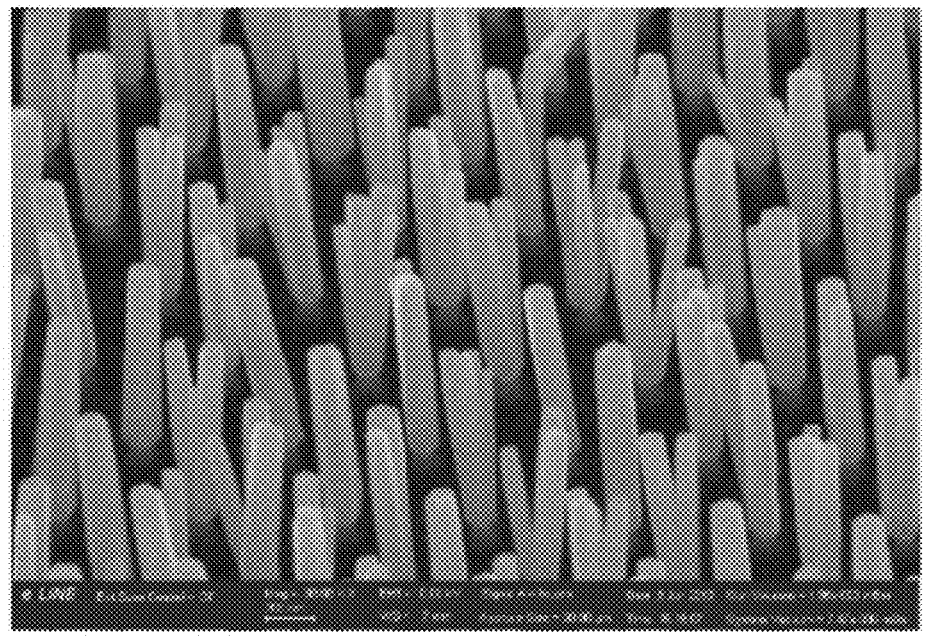
FIG. 12a illustrates a substrate with ZnO rods grown on a discrete seeded area.
Figure 12B:
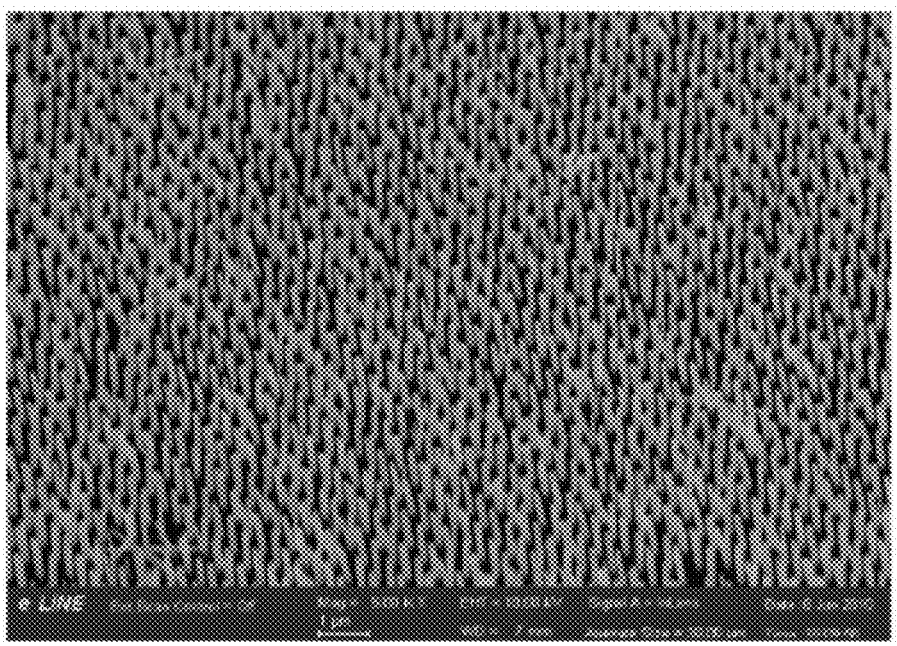
FIG. 12b illustrates a substrate with ZnO rods grown on a discrete seeded area.

FIGS. 12a and 12b illustrate a substrate with ZnO rods grown on a discrete seeded area.

The size of the seeded area can be controlled so that just single rod is built up on each seeded area. Techniques such as stamping and imprinting can be used to define seeded areas over the substrate.

In one embodiment, the pitch of the discrete regions of seed material lies in the range of 400 nm to 900 nm. In one example, the pitch is 700 nm.

Figure 13:
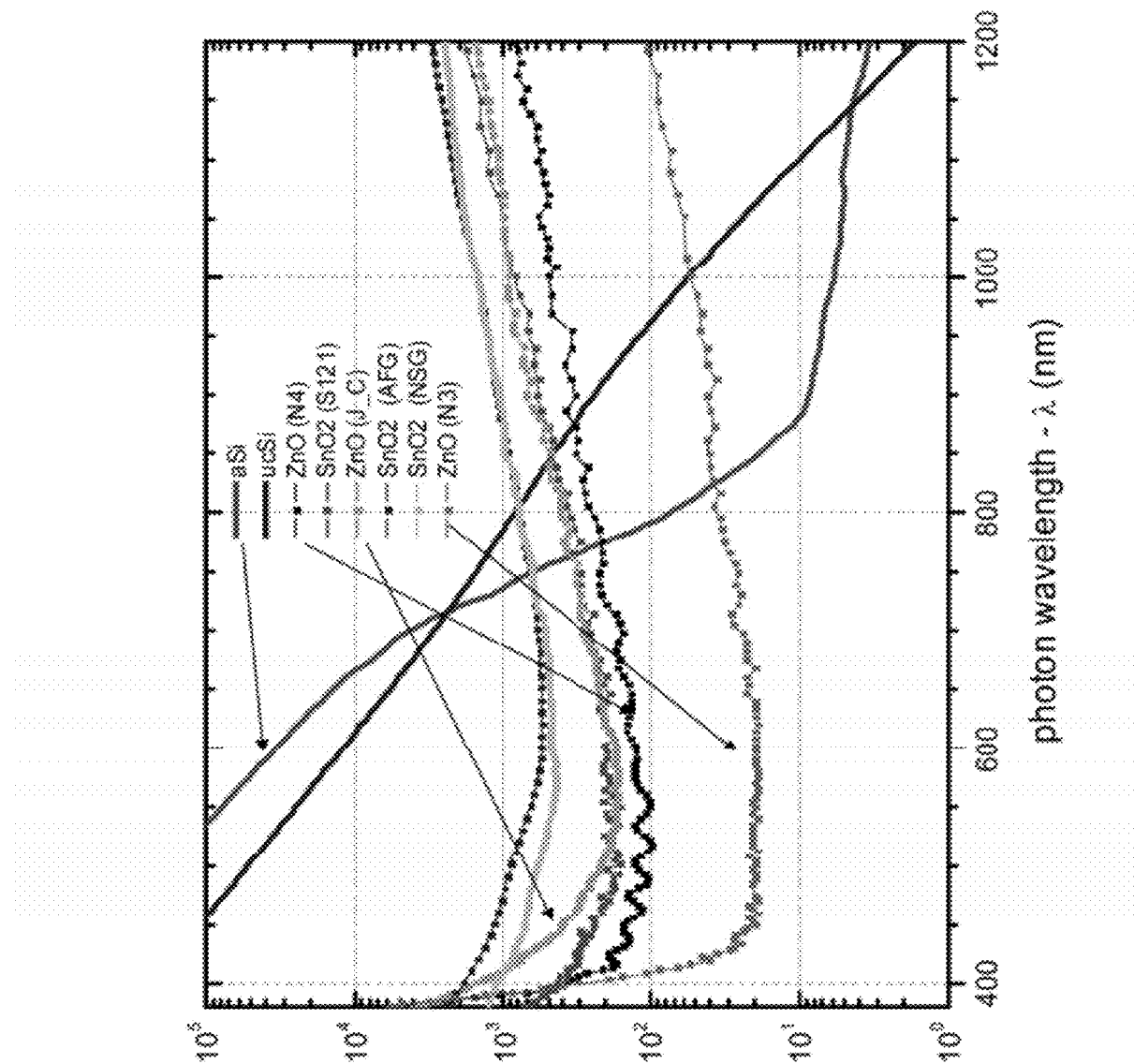
FIG. 13 illustrates a graph of optical absorption coefficient as a function of photon wavelength.
Figure 14:
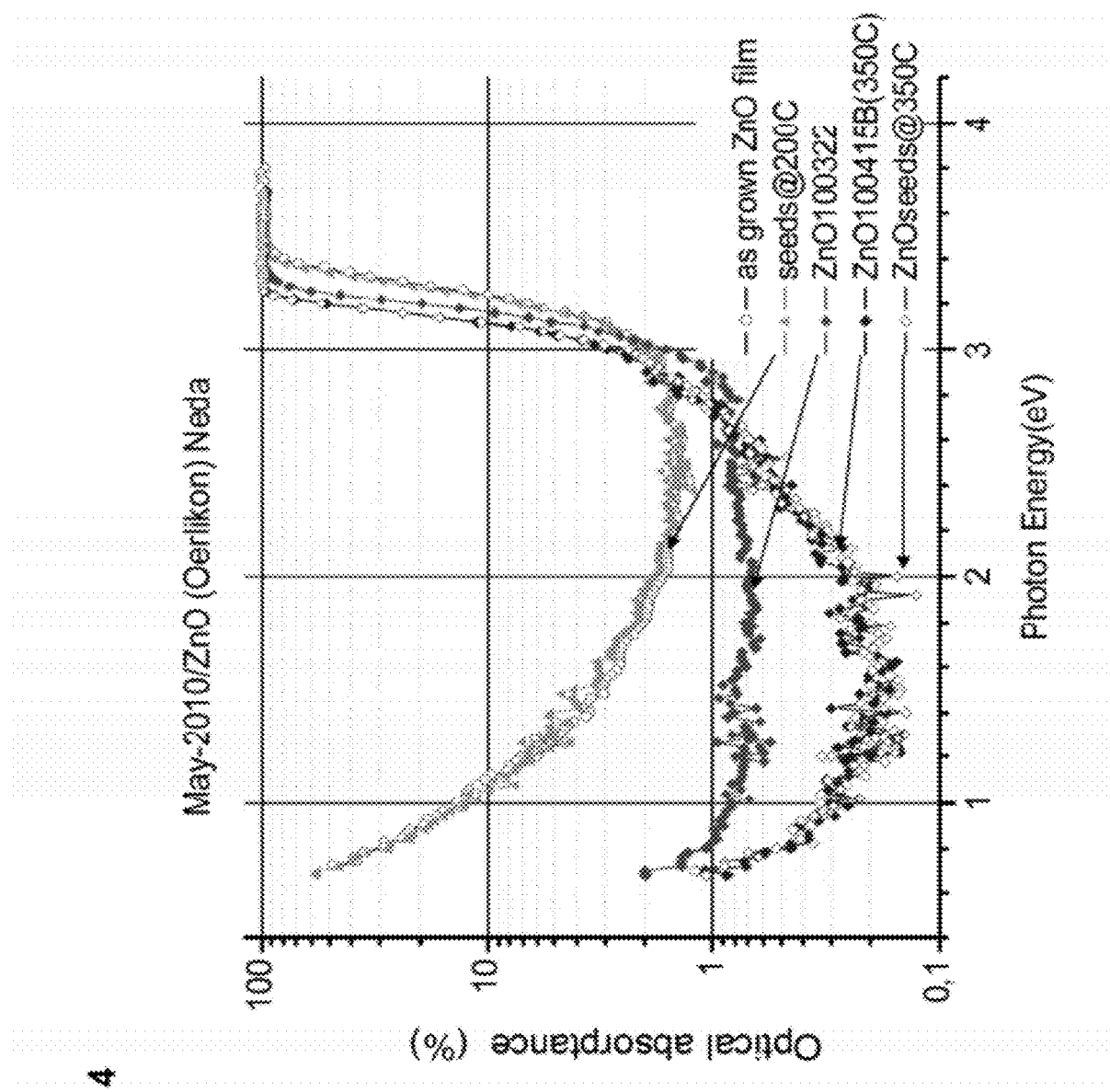
FIG. 14 illustrates a graph of optical absorptance as a function of photon energy.

Optical properties measured for single crystalline ZnO rods, grown by hydrothermal synthesis are illustrated in FIGS. 13 and 14.

Optical loss, that is the coefficient of the optical absorption, in the ZnO structures including a sub-layers and rods is a factor. It should be compared and should be generally lower in the spectral range of interest than the corresponding coefficient of optical absorption of the photovoltaically active layer such as a Si absorber. The silicon absorber may be amorphous or microcrystalline.

FIG. 13 illustrates a graph of optical absorption coefficient as a function of photon wavelength and FIG. 14 illustrates a graph of optical absorptance as a function of photon energy.

Photothermal deflection spectroscopy (PDS) is a method for the measurement of a small absorption loss, even in a strongly scattering medium. A PDS setup is used to measure simultaneously transmittance T, reflectance R and absorptance As a light source the 150 W Xe lamp, the monochromator equipped with UV, VIS and IR gratings and optical filters are used. The spectra can be measured automatically in 250-1700 nm range via integrating spheres equipped with calibrated Si and InGaAs photodiodes. The sample is placed on a vibration-free table separated from monochromator and chopper. An independent is used to monitor the incident light intensity.

PDS measurement on a) ZnO doped layer on glass and b) the same with ZnO rods on top have shown similar optical absorptance, dominated by the ZnO sub-layer not the ZnO rods. It is concluded that ZnO rods are highly transparent and electrically less conducting. Strong optical scattering by ZnO rods increases 1-T-R and destroys interferences Thus, optical loss of the ZnO rods deposited by hydrothermal synthesis is, in this embodiment, smaller compared to the standard industrial ZnO layers.

The invention having been thus described with reference to certain specific embodiments and examples of, it will be understood that this is illustrative, and not limiting, of the appended claims.

The invention claimed is:

1. A method comprising:
    providing a substrate comprising a first transparent conductive layer,
    depositing a seed layer onto the first transparent conductive layer using a mask to produce a structured seed layer,
    building up a plurality of transparent conductive rods on the structured seed layer,
    depositing a photovoltaically active layer onto the transparent conductive rods,
    depositing a conductive layer onto the photovoltaically active layer.

2. The method according to claim 1, wherein
    a closed seed layer is deposited and portions of the closed seed layer are removed.

3. The method according to claim 1, wherein
    the seed layer is deposited by depositing a solution comprising zinc acetate dehydrate and ethanol onto the substrate and heat treating.

4. The method according to claim 1, wherein
    the transparent conductive rods are built up using a hydrothermal synthesis technique.

5. The method according to claim 1, wherein
    the transparent conductive rods are built up by immersing the substrate in a solution comprising zinc nitrate hexahydrate and hexamethylenetetramine at a temperature T for a time t.

6. The method according to claim 5, wherein
    the temperature T lies in the range 60 to 120° C.

7. The method according to claim 5, wherein
    the time t lies in the range of 20 minutes to 100 minutes for a temperature T of 95° C.

8. The method according to claim 1, wherein
    the photovoltaically active layer is a silicon layer comprising a charge separating junction.

9. The method according to claim 8, wherein
    the silicon layer is deposited by chemical vapour deposition.

10. The method according to claim 8, wherein
the silicon layer is deposited by plasma enhanced chemical vapour deposition.

11. The method according to claim 1, wherein
the conductive layer is transparent.

12. The method according to claim 10, wherein
the conductive layer is deposited by chemical vapour deposition.

13. The method according to claim 1, wherein
the first transparent conductive layer is deposited by low pressure chemical vapour deposition.

14. The method according to claim 1, wherein
the photovoltaically active layer is deposited conformally onto the transparent conductive rods.

15. The method according to claim 1, wherein
the conductive layer is deposited conformally onto the photovoltaically active layer.

16. The method according to claim 1, wherein the structured seed layer comprises a plurality of discrete seed regions, the seed regions having a diameter in a range of about 100 nm to about 150 nm, and
wherein the building up of the transparent conductive rods occurs on the seed regions.

\* \* \* \* \*

UNITED STATES PATENT AND TRADEMARK OFFICE
CERTIFICATE OF CORRECTION

| | | |
|---|---|---|
| PATENT NO. | : 8,772,080 B2 | Page 1 of 1 |
| APPLICATION NO. | : 13/156533 | |
| DATED | : July 8, 2014 | |
| INVENTOR(S) | : Milan Vanecek | |

It is certified that error appears in the above-identified patent and that said Letters Patent is hereby corrected as shown below:

On the title page, under (73) Assignees:, replace "Fyzikalni Ustave AV CR, V.V.I." with - Fyzikalni Ustav AV CR, V.V.I. -

Signed and Sealed this
Eighth Day of December, 2015

Michelle K. Lee
*Director of the United States Patent and Trademark Office*